United States Patent [19]

Ernst et al.

[11] 4,053,793
[45] Oct. 11, 1977

[54] MODULAR LOGIC CIRCUIT FOR PERFORMING DIFFERENT LOGIC FUNCTIONS

[75] Inventors: Wolfram Ernst, Munich; Josef Rohrig, Oberhaching; Gerhard Renz, Neuried, all of Germany

[73] Assignee: Siemens Aktiengesellschaft, Munich, Germany

[21] Appl. No.: 670,160

[22] Filed: Mar. 25, 1976

[30] Foreign Application Priority Data

Mar. 25, 1975 Germany ............................. 2513153

[51] Int. Cl.² .......................................... H03K 19/08
[52] U.S. Cl. ................................... 307/207; 307/213; 328/92; 328/97
[58] Field of Search ............... 307/203, 241, 207, 242, 307/213, 208; 328/92, 97, 71, 55; 340/172.5

[56] References Cited

U.S. PATENT DOCUMENTS

| 3,344,356 | 9/1967 | Aycock et al. ......................... 328/97 |
| 3,675,049 | 7/1972 | Haven ..................................... 328/55 |
| 3,728,534 | 4/1973 | Bertram et al. ....................... 307/207 |
| 3,784,918 | 1/1974 | Fassbender .............................. 328/97 |
| 3,919,695 | 11/1975 | Gooding ............................ 340/172.5 |

Primary Examiner—Stanley D. Miller, Jr.
Attorney, Agent, or Firm—Schuyler, Birch, Swindler, McKie & Beckett

[57] ABSTRACT

A modular logic circuit capable of performing a plurality of different logic functions is described. A first portion of the modular circuit containing logic elements receives input pulse signals and, responsive to signals received from a control circuit forming a second portion of the modular circuit, produces an output pulse having time position and/or length relationships to the input pulses which are functions of the values of the signals from the control circuit. A third portion of the modular circuit receives input pulses having no relationship to the inputs to the first portion; logic circuits in the third portion receive the latter input pulses and signals from the control circuit and produce another output signal the length and/or time position of which in relation to the input pulses is determined by the signals from the control unit.

4 Claims, 18 Drawing Figures

Fig. 3

| X | Y | A2 |
|---|---|----|
| L | L | L  |
| L | H | H  |
| H | L | H  |
| H | H | H  |

Fig. 4

| P1 | P2 | A2 | T1 | T3 |
|----|----|----|----|----|
| H  | H  | H  | B1 | B3 |
| L  | H  |    | B2 | B2 |
| L  | L  |    | B3 | B3 |
| H  | L  |    | B3 | B2 |

Fig. 5

| E1 | E2 | E3 | A1 ||
|----|----|----|-----|-----|
|    |    |    | J=H | J=L |
| L  | L  | L  | H   | L   |
| L  | L  | H  | L   | H   |
| L  | H  | L  | L   | H   |
| L  | H  | H  | L   | H   |
| H  | L  | L  | H   | L   |
| H  | L  | H  | L   | H   |
| H  | H  | L  | H   | L   |
| H  | H  | H  | H   | L   |

Fig. 6

| E4 | A3 |
|----|----|
| L  | L  |
| H  | H  |

Fig. 7

| J = L | VA = $\overline{E1} \wedge E2$ |
|---|---|
| J = H | VA = $E1 \wedge E2$ |

| E1 | E2 | VA | |
|---|---|---|---|
| | | J=L | J=H |
| L | L | H | L |
| L | H | H | L |
| H | L | H | L |
| H | H | L | H |

| J = L | VA = $E2 \vee E3$ |
|---|---|
| J = H | VA = $\overline{E2} \vee E3$ |

| E2 | E3 | VA | |
|---|---|---|---|
| | | J=L | J=H |
| L | L | L | H |
| L | H | H | L |
| H | L | H | L |
| H | H | H | L |

| J = L | VA = $(\overline{E1} \wedge E2) \vee (E1 \wedge \overline{E2})$ |
|---|---|
| J = H | VA = $(\overline{E1} \wedge \overline{E2}) \vee (E1 \wedge E2)$ |

| E1 | E2 | VA | |
|---|---|---|---|
| | | J=L | J=H |
| L | L | L | H |
| L | H | H | L |
| H | L | H | L |
| H | H | L | H |

| J = L | VA = $\overline{E1}$ |
|---|---|
| J = H | VA = $E1$ |

| E1 | E3 | VA | |
|---|---|---|---|
| | | J=L | J=H |
| L | L | H | L |
| L | H | H | L |
| H | L | L | H |
| H | H | L | H |

| J = L | VA = $\overline{E1} \wedge E3$ |
|---|---|
| J = H | VA = $E1 \vee \overline{E3}$ |

| E1 | E3 | VA | |
|---|---|---|---|
| | | J=L | J=H |
| L | L | L | H |
| L | H | H | L |
| H | L | L | H |
| H | H | L | H |

(E1 → E2)

4,053,793

MODULAR LOGIC CIRCUIT FOR PERFORMING DIFFERENT LOGIC FUNCTIONS

BACKGROUND OF THE INVENTION

The invention relates to a modular circuit construction having more than one logic element for different logic functions to which input signals to be combined are applied in the form of input pulses of longer or shorter duration, and by which, an output pulse is supplied as output signal.

Data processing systems comprise a large number of units that must receive signals from superordinate or subordinate other units or must supply signals thereto. In systems having an intermediate-level or central control unit such signals must be exchanged with comparatively short transmission times. Such systems also call for maximum centralization of functions with attendant economy of hardware.

The use of integrated circuits in the form of modular circuits capable of performing a maximum number of functions is of particular advantage to the interfaces of the individual units of such data processing systems. Moreover, optimum economy can be achieved if only a few types of such modular circuits are employed.

This accounts for the demand for versatile modular circuits. Therefore, it is of advantage to employ a modular circuit that carries out internal changes or switching responsive to control signals with a view to changing the functions it is capable of performing.

Instances of programmable logic circuits having variable functions in which different operations can be defined have been reported in the literature through the action of external electric signals (cf. "Siemens-Schaltbeispiele" 1974/75, pp. 139–141 "Universeller Zeit- und Zahlerbaustein").

West German Auslegeschrift No. 1,943,844 corresponding to U.S. Pat. No. 3,500,158 describes an integrated semiconductor circuit for the mutual allocation of input and output signals as a function of a given binary code in which a plurality of circuit stages are provided with logic elements and control elements. The control elements in such circuits have a first and a second state of transmission in which a control circuit is provided with input connections to the logic elements for the selective control thereof in accordance with a given binary code. An operating input circuit is provided in this circuit arrangement having current paths connected to the control elements and causing the permanent switching of the control elements from the first to the second state of transmission as a function of control signals applied thereto and in accordance with the given binary code.

An object of the invention is to provide an integrated modular circuit having great versatility and, hence, capable of performing a comparatively large number of different functions.

It is another object of the invention to provide a modular logic circuit capable of performing on the interface of various units in a data processing system or the like the tasks of signal receivers or signal transmitters or carry out logic operations and thereby evaluate condition signals in such units.

SUMMARY OF THE INVENTION

The foregoing and other objects are attained in a modular circuit having more than one logic element for different logic functions to which input signals to be correlated are applied in the form of input pulses of shorter or longer duration. The logic circuit produces an output pulse as an output signal. The modular circuit is thus characterized in that the first portion of the logic elements can be influenced by a control circuit acting as the second portion of the modular circuit. The second portion is connected to one or more logic elements, such connections defining the length and/or time position of the output pulse to be supplied in each case compared to the associated input pulses. The control circuit further affects in a third portion of the modular circuit the length and/or time position of another output pulse produced by an independent and uncorrelated input pulse. The control circuit, in turn, also has logic elements, over the outputs of which the effect of the output pulses may be defined selectively in different combinations as a function of control signals applied thereto.

The invention has the advantage that a relatively large number of different functions that may be defined by control signals applied to the signal inputs of the modular circuit can be performed and that such a modular circuit has a variety of uses because of these capabilities. Due to the large number of possible places of employment, versatility also means that such modules can be made in large quantities, thus assuring profitable production and stockpiling.

Further developments of the invention are characterized in that the modular circuit is provided with Schmitt triggers having control inputs and that by connecting capacitors to these control inputs a signal shift is rendered possible or that output pulses may be obtained which are reduced with respect to input pulses by correlating the input pulses with the aid of logic elements with control signals of adequately short duration and consisting of control pulses delivered to the control inputs. Output pulses are obtained which are longer than the input pulses by sending the input pulses over one or more monstable circuits actuated by the control circuit with the aid of control signals and by connecting capacitors to the control inputs, or by sending the input pulses over one or more bistable circuits with a view to supplying output pulses of long duration. The bistable circuit is actuated by the control circuit using the control signals. The length and/or time position of output pulses supplied by the first and third portion of the modular circuit may be defined in all combinations by the control circuit using the control signals applied thereto.

Thus, the modular circuit built in accordance with the teachings of the invention also affords the possibility of defining in all combinations the length and/or time position of the output pulses to be supplied, viz. signal shifts, pulse reductions, pulse lengthenings and conversion of input pulses of short duration to output pulses of long duration. For example, when supplying a lengthened output pulse to a slow-response receiver, e.g., an electromechanical relay, it is of advantage that, if necessary, a reduced output pulse be supplied over the other signal output of the modular circuit.

Another further development of the invention is that the input signals to be correlated are each applied to two signal inputs of a triple signal input of the first portion of the modular circuit, a particular control signal being applied to the third input of said triple signal input. The first portion further has an inversion input over which the inversion of the logic function concerned is caused by another control signal. The logic function is dependent upon the application of the particular control signal to one of the three signal inputs of the triple signal input. The advantageous feature of this further development is seen in the fact that the circuit arrangement built in accordance with the teachings of the invention enables the execution of all essential logic operations of two variables through the use of a small number of input terminals.

BRIEF DESCRIPTION OF THE DRAWINGS

The principles of the invention will be more readily understood by reference to the descriptions of preferred embodiments given hereinbelow in conjunction with FIGS. 1 - 18.

FIGS. 3, 4, 5 and 6 are truth tables for various input and output applications of the FIG. 1 embodiment.

FIGS. 7, 8, 9, 10 and 11 are circuit diagrams and associated tables showing the various input applications of the triple signal input of the first portion of the FIGS. 1 and 2 modular circuit with the associated truth tables and the resulting Boolean expressions for the logic output VA.

DETAILED DESCRIPTION OF THE DRAWINGS

Figure 1:
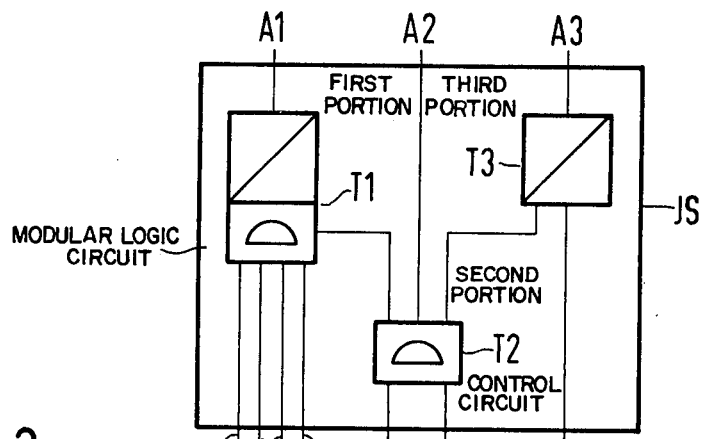
FIG. 1 is a block diagram showing the basic configuration of a modular logic circuit constructed according to the principles of the invention.

For clarity, the reference symbols for inputs, such as signal inputs, and outputs are used in the drawings for designating the signals occurring thereat.

FIG. 1 shows a preferred embodiment of the basic design of the modular logic circuit according to the invention. The first portion T1 is shown as a transducer having a logic element connected upstream to which are allocated several signal inputs and one signal output to be correlated. It can also be seen in FIG. 1 that control circuit T2, which must perform the logic functions for signal inputs P1 and P2, has three signal outputs, viz. signal output A2 brought out of modular circuit JS and two signal outputs affecting the first portion T1 and the third portion T3. The latter portion is provided with only one signal input E4 and the signal output A3.

The function of the second portion T2 operating as a control circuit will now be described.

Figure 2:
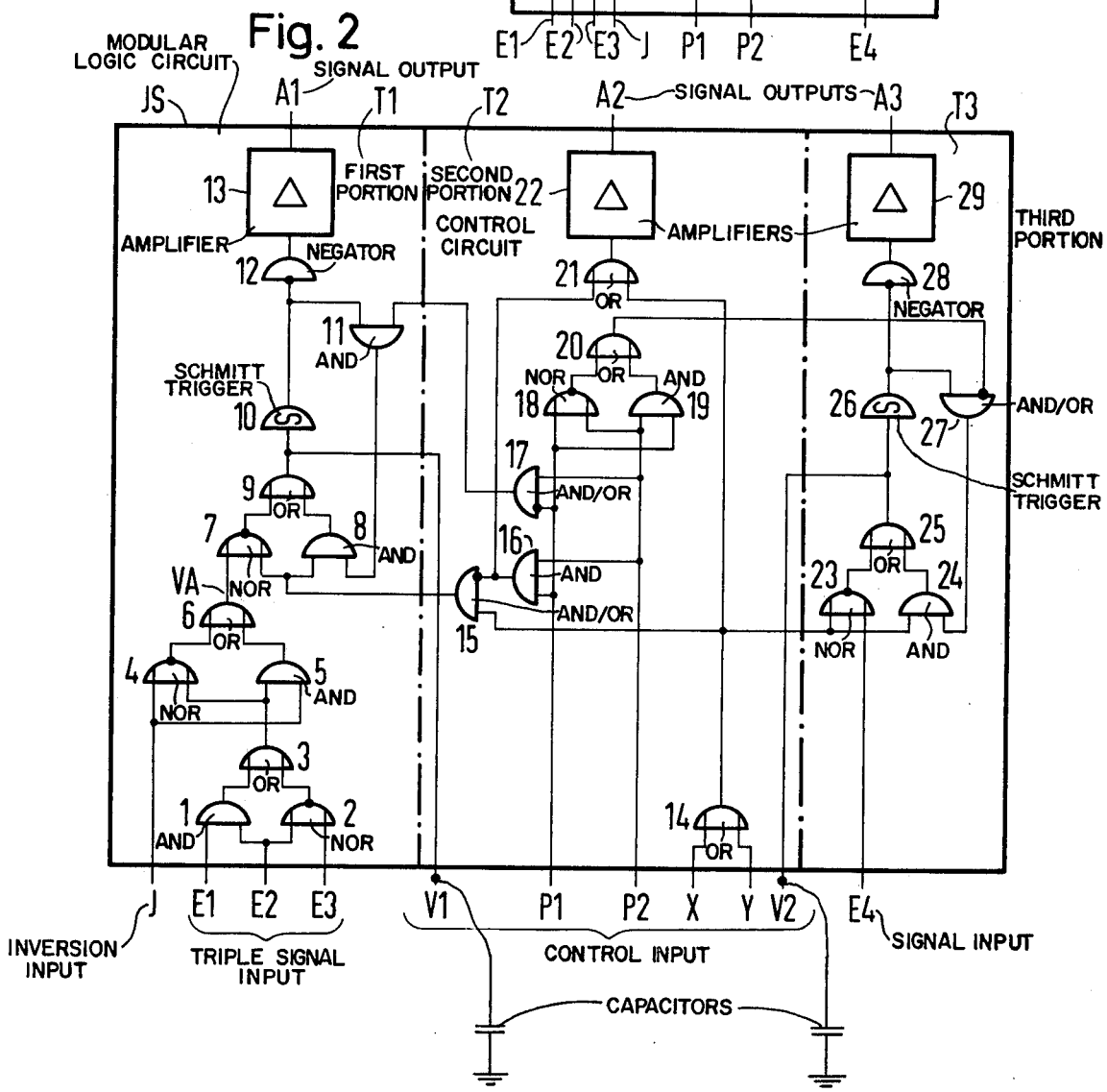
FIG. 2 is a schematic diagram showing in detail the complete circuit arrangement of the FIG. 1 embodiment of the modular circuit JS.

It is apparent from the embodiment of modular circuit JS shown in FIG. 2 that all six signals inputs, viz., X, Y, P1, P2, V1 and V2, are allocated to the second portion T2 of the modular circuit JS, the control circuit for the modular circuit. The control inputs X and Y lead to the inputs of OR gate 14, the output of which is connected to each of the inputs of logic elements 15, 21, 23 and 24. When the input signals are applied simultaneously to inputs X and Y, a binary digit is likewise produced at the output of logic element 14. In this case, modular circuit JS is enabled for logic and/or switching operations to be defined during its further operations, otherwise it is disabled.

Control inputs P1 and P2 are each connected to one input of logic elements 16, 17, 18 and 19. The operation of the modular circuit as shown in FIG. 4 is predetermined by means of control signals supplied to these control inputs. It is apparent from columns T1 and T3 which mode, i.e., B1, B2 or B3, shall be performed by portions T1 and T3 of the modular circuit depending on the assumed input situation at control inputs P1 and P2, wherein H corresponds to a high binary state (1) and L corresponds to a low binary state (0).

These three modes are explained in FIGS. 5a, 5b and 5c with the aid of time-waveform diagrams, wherein:

E is the input signal as correlated input signals to J, E1, E2, E3 at the output of the input combining circuit VA or uncorrelated input signal at signal input E4.

XVY is the output signal at the output of OR gate 14, wherein V corresponds to an OR logic operation.

A is the output signal at signal output A1 or signal output A3.

H is binary digit H (R = idle condition),

L is binary digit L (S = signal state).

It is apparent from FIG. 3 that the signal output of control T2, i.e., A2, only takes the binary digit L, if the control inputs X and Y also have this binary digit. In the three other input situations shown the binary digit H appears at signal output A2.

An exception to the rule occurs if concurrently with the adjustment of the binary digit L at control inputs X and Y, the binary digit H appears at the other control inputs P1 and P2. In this case, signal output A takes the binary digit H, as apparent from FIG. 4.

In this case, the AND gate 16 has at its output the binary digit H, by which the binary digit H is set at the input of the amplifier 22 over the OR gate 21 as if at least one of the two control inputs X or Y were set for the binary digit H.

The following list shows the relationships between the control signals, input signals and output signals.

| P1 | H | L | L | H |
|---|---|---|---|---|
| P2 | H | H | L | L |
| XVY(14) | H H L H H | H H L H H | H H L H H | H H L H H |
| 15 | L L L L L | H H L H H | H H L H H | H H L H H |
| 16 | H H H H H | L L L L L | L L L L L | L L L L L |
| 17 | L L L L L | H H H H H | L L L L L | L L L L L |

-continued

|  | | | | |
|---|---|---|---|---|
| 18 | L L L L L | L L L L L | H H H H H | L L L L L |
| 19 | H H H H H | L L L L L | L L L L L | L L L L L |
| 20 | H H H H H | L L L L L | H H H H H | L L L L L |
| 21 | H H H H H | H H L H H | H H L H H | H H L H H |
| A2(22) | H H H H H | H H L H H | H H L H H | H H L H H |
| VA (6) | H L L L H | H L L L H | H L L L L | H L L L L |
| 7 | L H H H L | L L H L L | L L H L L | L L H L L |
| 8 | L L L L L | L L H H H | L L L L L | L L L L L |
| 9 | L H H H L | L L H H H | L L H L L | L L H L L |
| 10 | L H H H L | L L H H H | L L H L L | L L H L L |
| 11 | L L L L L | L L H H H | L L L L L | L L L L L |
| 12 | H L L L H | H H L L L | H H L H H | H H L H H |
| A1(13) | H L L L H | H H L L L | H H L H H | H H L H H |
|  | B1 | B2 | B3 | B3 |
| E4 | H L L L L | H L L L H | H L L L L | H L L L H |
| 23 | L L H L L | L L H L L | L L H L L | L L H L L |
| 24 | L L L L L | L L L H H | L L L L L | L L L H H |
| 25 | L L H L L | L L H H H | L L H L L | L L H H H |
| 26 | L L H L L | L L H H H | L L H L L | L L H H H |
| 27 | L L L L L | L L H H H | L L L L L | L L H H H |
| 28 | H H L H H | H H L L L | H H L H H | H H L L L |
| A3(29) | H H L H H | H H L L L | H H L H H | H H L L L |
|  | B3 | B2 | B3 | B2 |

Figure 13:
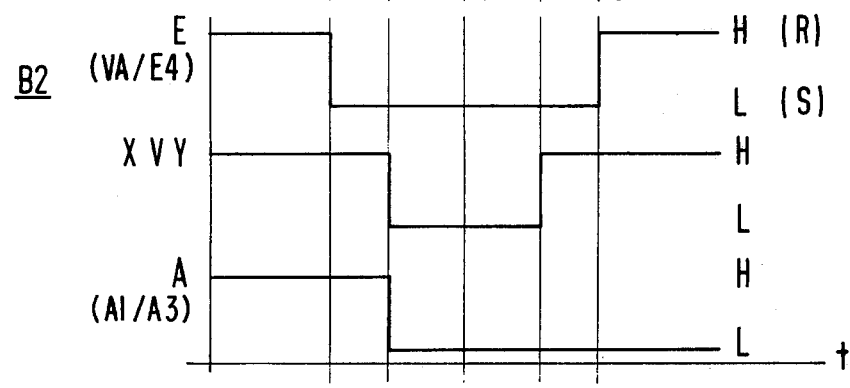

It is apparent from this list how the modes B1, B2, B3 shown in FIG. 4 and the combinations thereof come about as a function of the control signals P1 and P2. FIG. 13 (mode B2) shows that an output signal, i.e., the binary digit L, is maintained even at the end of an input pulse and a control pulse. This is caused by the interconnection of logic elements produced responsive to control signals into a bistable circuit, i.e., 8, 9 and 11 in the first portion T1 and 24, 25 and 27 in the third portion T3 of the modular circuit JS.

Figure 12:
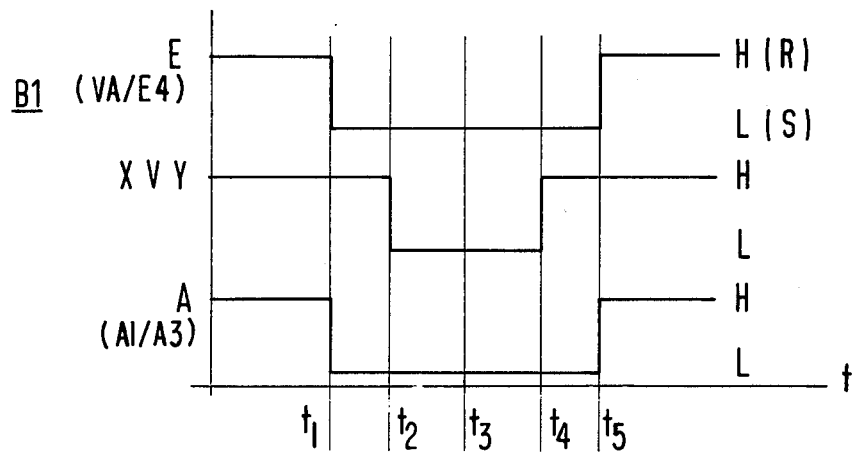
FIGS. 12, 13 and 14 are waveform diagrams showing examples of three required modes B1, B2 and B3.
Figure 14:
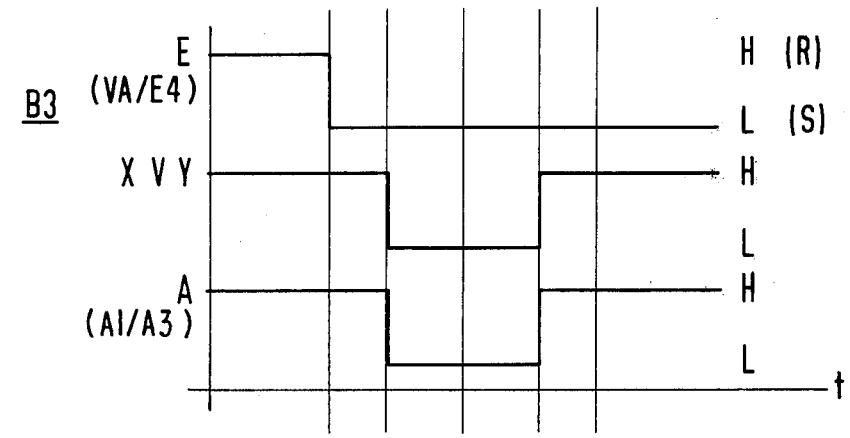

The binary digits shown are combined into four main groups, i.e., a group for P1 = H / P2 = H, P1 = L / P2 = H, P1 = L / P2 = L and P1 = H / P2 = L. Each of these groups have five columns, each representing a distinct time frame ($t_1$-$t_5$), the significance of which is apparent from line XVY (14) corresponding to the control signals, and lines VA (6) and E4 corresponding to the input signals. If these lines are ordered from left to right, in time sequence $t_1$ to $t_5$, the binary digits of control and input signals for a complete switching cycle as shown in FIGS. 12, 13 and 14 will be developed. Lines A2 (22), A1 (13) and A3 (29) indicate the output-signal binary digits being set in each case. The modes B1, B2 or B3 indicated therebelow refer to the relationships shown in FIGS. 12, 13 and 14 between control signals, (XVY), and input signals VA, E4 and output signals, A1, A3, respectively.

The binary digits shown for line VA (6) are obtained from the correlation of the input signals supplied to the triple signal input of the first portion of the modular circuit.

FIGS. 7-11 show the combining circuit with the triple signal input E1, E2, E3 and the inversion input J, as well, as an assumed logic output VA, likewise labelled T1 in FIG. 2. The symbol ∧ corresponds to an AND logic operation; whereas the symbol V corresponds to an OR logic operation. A truth table is shown in the right-hand portion of the figures in the two left columns of which the binary digits of two input variables are shown.

The two right-hand columns show the binary digit resulting from the respective operation at the logic output VA assumed, that is, first if the binary digit L and, second, if the binary digit H, is supplied to inversion input J. Moreover, the resulting Boolean expressions for J = L or J = H are shown in the figures.

In FIG. 7 the two input variables are represented by E1 and E2. In this type of operation the binary digit H is supplied to signal input E3. If a NAND operation of the two input variables E1 and E2 is required, the binary digit L must be supplied to the inversion input J. If an AND operation of these two variables are required, the binary digit H must be supplied to the inversion input.

The possibilities of an OR or NOR operation of two input variables, i.e., E2 and E3, are shown in FIG. 8. To do this, the signal input E1 must have the binary digit L.

FIG. 9 shows the possibilities for an exclusive OR operation if J = H or an equivalence operation if J = L. In this case the two input variables are E1 and E2. For these two cases the signal input E3 must be connected to the signal input E1.

FIG. 10 shows how the two input variables E1 and E3 are processed using a negation operation, if J = L, or an identity operation if J = H. In these two types of operations the binary digit H must be supplied to signal input E2.

Finally, FIG. 11 shows the possibility of how the two input variables E1 and E3 undergo an exclusion if J = L, or an inclusion if J = H. For these types of operations signal input E4 must be connected to signal input E1.

All 10 relevant logic functions of two input variables represent "nontrivial" operations. The combining switching arrangement with the triple signal input and inversion input permits all logic functions, however. The six other possible logic functions were no longer shown due to their triviality or because they have no practical significance.

Finally, FIG. 5 shows which binary digit is obtained for the 16 possible input signal combinations at the triple signal input E1, E2, E3 in combination with the two possible binary digits H and L for the inversion input at output A1. The binary digits at the signal output are independent of the mode, which determines only the length or time position of the output signal and not its binary digit.

By wiring the other control inputs of the second portion T2 of the modular circuit JS, namely V1 and/or V2, with capacitors, as shown in FIG. 2, the time waveform diagrams shown in FIGS. 12, 13 and 14 corresponding to the three modes B1, B2 and B3 may be varied such that a displacement in time of pulse start and/or pulse finish of output signals A takes place. By this means, the time displacement of pulse start and pulse finish may be effected either by the same amount or different amounts through intermediate switching of the capacitances.

In the practical embodiment of the invention, pulse shifts may be achieved within a range of several microseconds up to a few hundred milliseconds. Thus, the modular logic circuit can well be adapted to the conditions in various places where it might be employed.

FIG. 6 shows the relationship between the binary digit applied to signal input E4 and the resulting binary digit at signal output A3.

FIGS. 15, 16, 17 and 18 illustrate practical embodiments of systems wherein the invention might be used.

Figure 15:
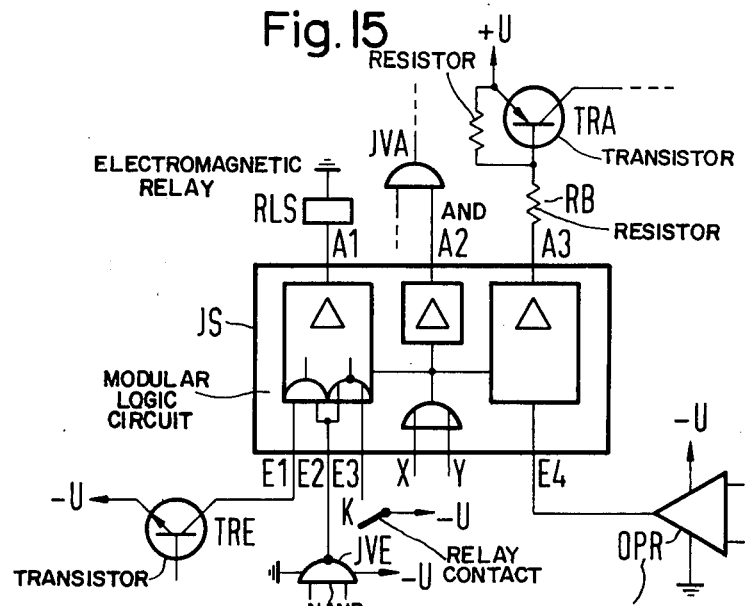
FIG. 15 is a schematic diagram showing the inputs and outputs of the FIG. 1 embodiment wired with signal transmitters or signal receivers of various states of technology.

FIG. 15 shows the wiring scheme of the signal inputs and outputs of the modular circuit JS with signal transmitters and receivers of diverse forms of construction. Thus, in the practical embodiment described in this Figure one may, for example, use as signal transmitters: transistors TRE, integrated logic circuits JVE, integrated operational amplifiers OPR or relay contacts. As signal receivers may be used electromagnetic relays RLS, integrated logic elements JVA or controlled systems of discrete transistors TRA.

Figure 16:
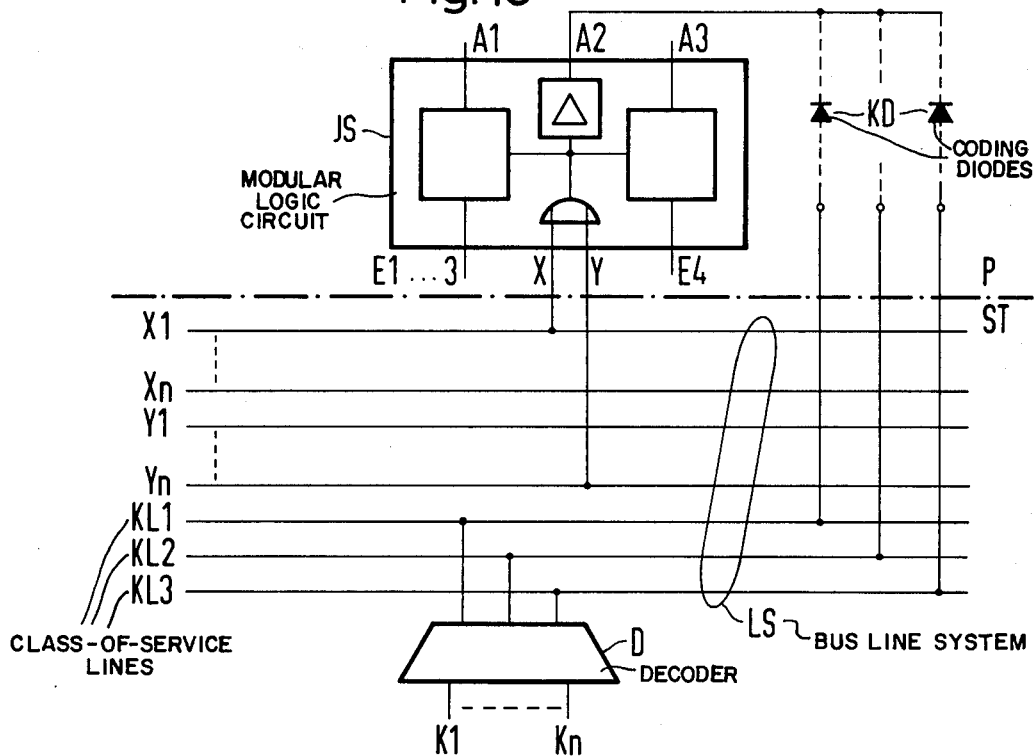
FIG. 16 is a schematic diagram showing a practical example of the FIG. 1 modular circuit used in a telephone switching system in which an encoded class-of-service signal is produced with the aid of an answering signal indicating release and generated over control inputs X and Y, the answering signal being delivered over the signal output of the second portion A2.

FIG. 16 shows the switching arrangement for an application in which the control inputs X and Y are connected to address circuits of a bus-line system LS in a telephone switching system. Signal output A2 is connected by coding diodes KD to class-of-service lines KL1, KL2 and KL3. These lines are carried to the input of a decoder D, the outputs K1 ... K$n$ of which supply output signals obtained with the aid of the addressing method via address circuits X1 and Y$n$.

Figure 17:
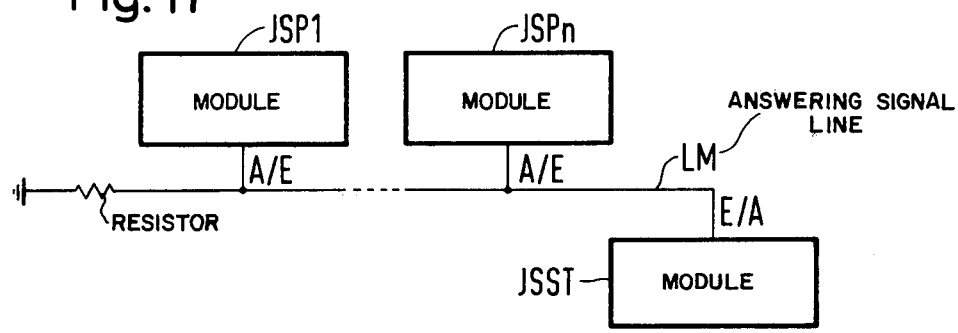
FIG. 17 is a block-schematic diagram showing the possibility of linking together, as desired, signal inputs or outputs of various modules constructed in accordance with FIGS. 1 and 2 over an answering-signal circuit in a telephone switching system.

FIG. 17 shows the possibility of connecting signal inputs or signal outputs of various modules, namely, JSP1 ... JSP$n$ over an answeringsignal line LM to signal inputs or outputs of a module JSST disposed at another level of a data processing system.

Figure 18:
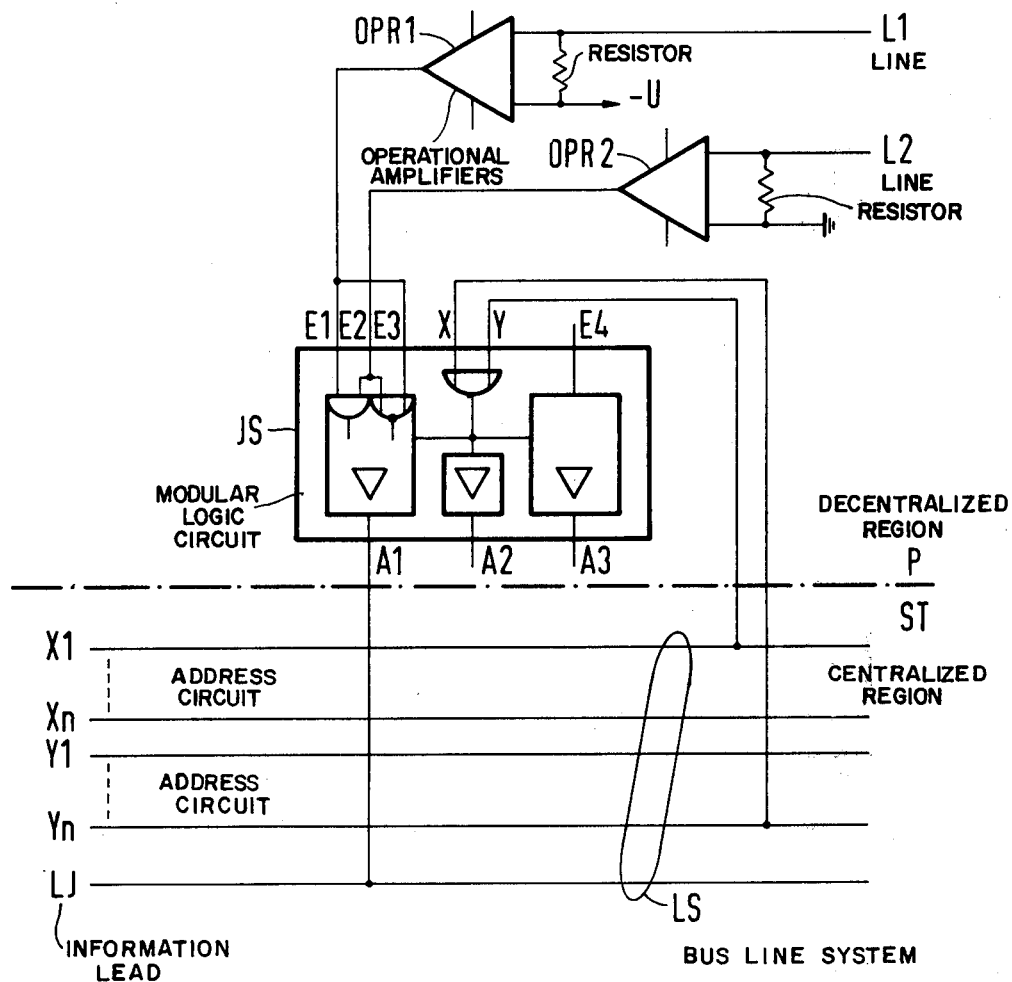
FIG. 18 is a schematic diagram showing the possibility of correlating condition signals of various circuits derived with the aid of operational amplifiers over the triple signal input of a modular circuit JS, as illustrated in FIGS. 1 and 2.

Finally, FIG. 18 shows an application for a modular circuit JS employed in the decentralized region P of a data processing system. When setting certain potentials on the lines L1 and/or L2, the operational amplifiers OPR1 and/or OPR2 supply corresponding binary digits to the terminals of the triple signal input. The control inputs X and Y are connected to address circuits X1 and Y$n$ of the bus-line system LS in the central region ST of the data processing system. An output signal corresponding to the logic result is supplied to an information lead LJ via signal output A1.

The principles of the invention are described hereinabove by describing the construction and operation of a preferred embodiment. The described embodiment is exemplary only, and it can be modified or changed in a number of ways known to those skilled in the art while remaining within the scope of the invention, as defined by the appended claims.

We claim:

1. A modular logic circuit for performing a plurality of differing logic functions comprising:
    first, second and third portions,
    said first portion comprising first logic circuit means for receiving first input pulse signals and for producing a first output pulse signal having a predetermined length and time position relationship to said first input pulse signals,
    said third portion comprising third logic circuit means for receiving a third input pulse signal which is independent of said first input pulse signals and for producing a third output pulse signal having a predetermined length and time position relationship with said third input pulse signal,
    said second portion comprising second logic circuit means including means for receiving control input signals and for producing therefrom control output signals, said control output signals having levels which cause said first and third logic circuit means to selectively produce said predetermined length and time position relationships.

2. The modular logic circuit defined in claim 1 further comprising:
    means for selectively displacing in time the leading and trailing edges of said first and third output pulse signals.

3. The modular logic circuit defined in claim 1 wherein said second portion further comprises blocking means for selectively enabling and disabling said first and third output signals responsive to additional control signals coupled to said blocking means.

4. The modular logic circuit defined in claim 3 wherein said second portion further comprises:
    means for producing a second output signal indicating enabling of said first and third output signals by said blocking means.

* * * * *